(12) United States Patent
Kawada et al.

(10) Patent No.: US 9,215,821 B2
(45) Date of Patent: Dec. 15, 2015

(54) ELECTRONIC DEVICE

(71) Applicant: Panasonic Corporation, Kadoma-shi, Osaka (JP)

(72) Inventors: Yoshihiro Kawada, Osaka (JP); Kenichi Shindo, Osaka (JP); Ryo Yonezawa, Kyoto (JP); Yoshinari Matsuyama, Osaka (JP); Hirofumi Sasaki, Hyogo (JP); Haruka Kaneko, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 221 days.

(21) Appl. No.: 13/940,618

(22) Filed: Jul. 12, 2013

(65) Prior Publication Data

US 2014/0085786 A1    Mar. 27, 2014

(30) Foreign Application Priority Data

Sep. 25, 2012   (JP) .................................. 2012-211485

(51) Int. Cl.
*H05K 5/04* (2006.01)
*B32B 7/12* (2006.01)

(52) U.S. Cl.
CPC ... *H05K 5/04* (2013.01); *B32B 7/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,356,313 A * | 10/1994 | Niwa et al. | .................. | 439/607.4 |
| 7,442,066 B1 * | 10/2008 | Ho et al. | ........................ | 439/358 |
| 7,465,194 B1 * | 12/2008 | Ho et al. | .................. | 439/607.01 |
| 8,840,749 B2 * | 9/2014 | Song | .............................. | 156/295 |
| 2007/0109737 A1 * | 5/2007 | Kriege et al. | ................. | 361/683 |
| 2008/0158799 A1 * | 7/2008 | Tai et al. | ........................ | 361/681 |
| 2011/0051348 A1 * | 3/2011 | Song | ......................... | 361/679.26 |
| 2013/0010435 A1 * | 1/2013 | Ogatsu | ........................... | 361/748 |
| 2013/0050918 A1 * | 2/2013 | Zadesky et al. | .......... | 361/679.01 |
| 2013/0088820 A1 * | 4/2013 | Kuroda | ..................... | 361/679.01 |
| 2013/0189537 A1 * | 7/2013 | Kawamoto et al. | ........... | 428/600 |
| 2013/0335644 A1 * | 12/2013 | Horii et al. | ..................... | 348/836 |
| 2014/0070680 A1 * | 3/2014 | Kawada et al. | ............. | 312/223.1 |
| 2014/0071649 A1 * | 3/2014 | Kawada et al. | ............... | 361/809 |
| 2014/0072761 A1 * | 3/2014 | Kawada et al. | ............... | 428/138 |
| 2014/0362539 A1 * | 12/2014 | Huang et al. | .................. | 361/721 |
| 2015/0055293 A1 * | 2/2015 | Shiraishi | .................. | 361/679.56 |

FOREIGN PATENT DOCUMENTS

JP    2001-024346    1/2001

* cited by examiner

*Primary Examiner* — Lisa Lea Edmonds

(74) *Attorney, Agent, or Firm* — Hamre, Schumann, Mueller & Larson, P.C.

(57) ABSTRACT

An electronic device 100 includes a casing 101 configured to accommodate electronic components. The casing 101 includes an outer layer member 131 formed by a metal and exposed to an outside, and an inner layer member 132 formed by a metal and spaced from an inner surface of the outer layer member 131. Conductive projections 140*a* and 140*b* are each formed between the inner layer member 132 and the outer layer member 131, and are each configured to extend like a line on a surface of one of the inner layer member 132 and the outer layer member 131 and have a top end that contacts with the other of the inner layer member 132 and the outer layer member 131, to electrically connect between the inner layer member 132 and the outer layer member 131.

12 Claims, 3 Drawing Sheets

ELECTRONIC DEVICE

BACKGROUND

1. Field

The present disclosure relates to electronic devices including casings which have an outer layer member and an inner layer member.

2. Description of the Related Art

Japanese Laid-Open Patent Publication No. 2001-24346 discloses a casing of an electronic device.

The casing includes: an outside portion formed by a metal plate being shaped; an inside portion formed by a metal plate being shaped; and an adhesive layer which adheres the outside portion and the inside portion to each other. The electronic device disclosed in Japanese Laid-Open Patent Publication No. 2001-24346 is, for example, a small-sized information reproduction device.

SUMMARY

The present disclosure is to make available an electronic device that includes a casing having an outer layer member and an inner layer member, and that is effective in reducing unneeded radiation.

An electronic device of the present disclosure includes a casing configured to accommodate electronic components, and the casing includes an outer layer member formed by a metal and exposed to an outside, and an inner layer member formed by a metal and spaced from an inner surface of the outer layer member, and a conductive projection is formed between the inner layer member and the outer layer member, and is configured to extend like a line on a surface of one of the inner layer member and the outer layer member and have a top end that contacts with the other of the inner layer member and the outer layer member, to electrically connect between the inner layer member and the outer layer member.

The electronic device according to the present disclosure is effective in reducing unneeded radiation.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of the patent claims.

Hereinafter, an exemplary embodiment will be described with reference to FIGS. 1 to 6.

[1. Entire Configuration of Electronic Device]

Figure 1:
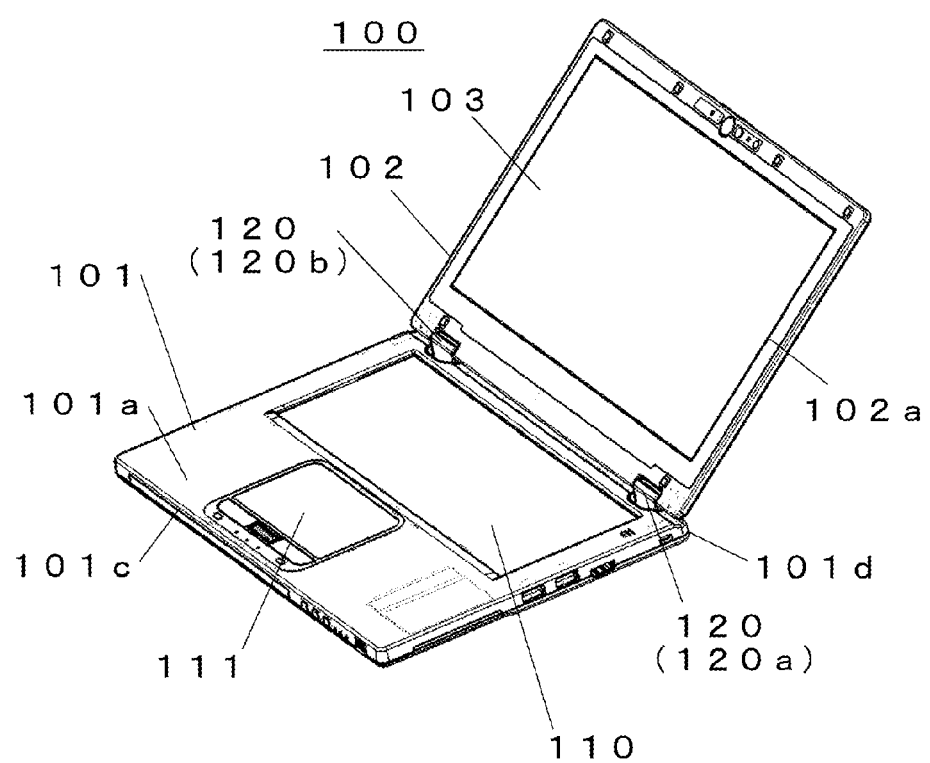
FIG. 1 is a perspective view of an electronic device, in an opened position, according to an embodiment.
Figure 2:
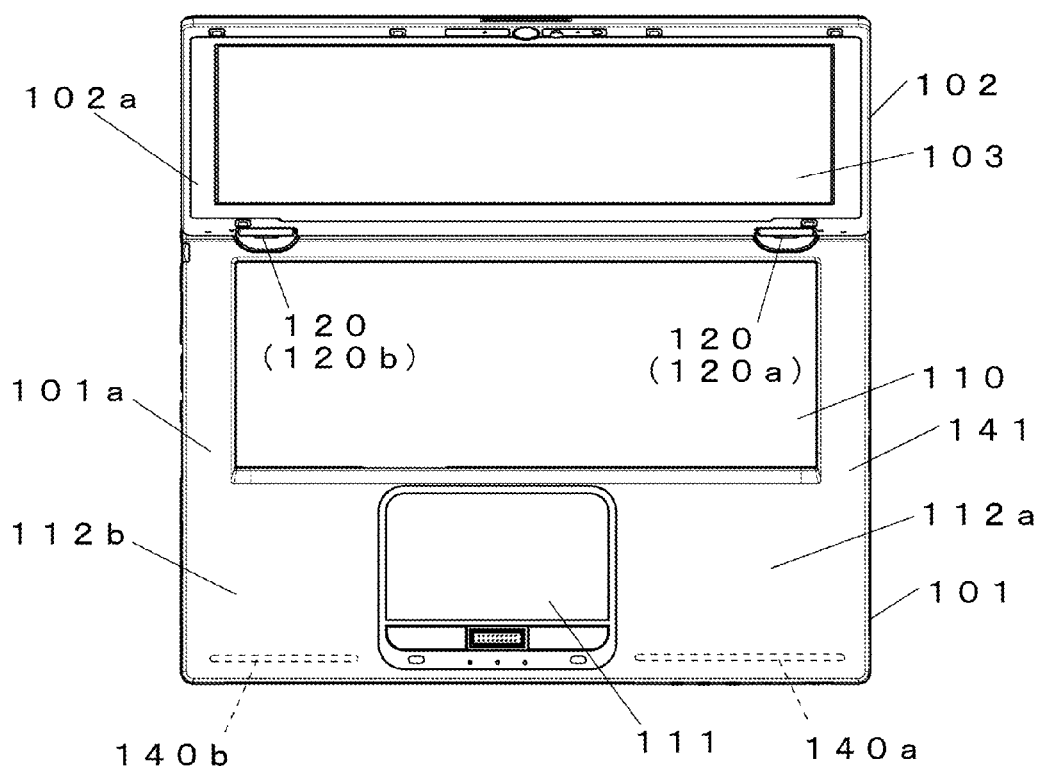
FIG. 2 is a top view of the electronic device, in the opened position, according to the embodiment.
Figure 3:
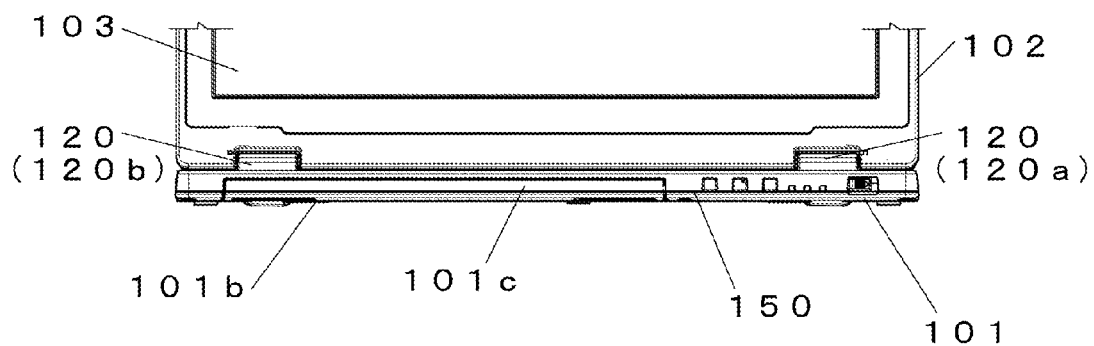
FIG. 3 is a front view of a front side end face of a first casing according to the embodiment.

FIG. 1 is a perspective view of an electronic device 100, in an opened position, according to the present embodiment. FIG. 2 is a top view of the electronic device 100, in the opened position, according to the present embodiment. FIG. 3 is a front view of a front side end face 101c of a first casing 101 according to the present embodiment.

As shown in FIG. 1, the electronic device 100 of the present embodiment is a notebook computer which is one example of an information processing apparatus. The electronic device 100 includes: a first casing 101 having an operation section provided thereon; a second casing 102 having a display 103 provided thereon; and a hinge mechanism 120 connecting a far side portion of the first casing 101 to one end portion (a lower side portion in FIG. 1) of the second casing 102. In the following description, the hinge mechanism 120 side of the first casing 101 is referred to as "far side" or "rear side", and a side opposite thereto is referred to as "near side" or "front side".

As shown in FIG. 1, the first casing 101 is a thin casing having a roughly rectangular shape as viewed in a planar manner. The first casing 101 has a top surface (main surface) 101a, a back surface 101b, the front side end face 101c, and a rear side end face 101d. The first casing 101 has, as electronic components, a CPU, a memory, an HDD, a battery, and the like (not shown). The electronic components radiate electric waves that may cause unneeded radiation.

As shown in FIG. 1 and FIG. 2, a first operation region 110 in which a keyboard (not shown) is provided, and a second operation region 111 in which a touch pad is provided, are formed on the top surface 101a of the first casing 101. For example, a portion through which the battery is removed is formed on the back surface 101b of the first casing 101 (not shown). A connection terminal for an electrical cord, a connection port (for example, a USB port) for a peripheral device, and the like are provided on the outer circumferential surface (a surface extending in the thickness direction of the first casing 101) of the first casing 101 (not shown).

Further, as shown in FIG. 2, a main plate-shaped portion 141 (a plate of the first casing 101 on the top surface side), of the first casing 101, having the top surface 101a includes two palm rest portions 112a and 112b that act as palm rests on which a user is allowed to rest palms when performing inputs on the keyboard. The two palm rest portions 112a and 112b are positioned forward of the first operation region 110. In FIG. 2, one of the palm rest portions, that is, the palm rest portion 112a, is positioned to the right of the second operation region 111, and the other of the palm rest portions, that is, the palm rest portion 112b is positioned to the left of the second operation region 111. Conductive projections 140a and 140b described below are provided inside the palm rest portions 112a and 112b, respectively, as shown in FIG. 2.

As shown in FIG. 1, the second casing 102 is a thin casing having a roughly rectangular shape as viewed in a planar manner. The shape and size of the second casing 102 are almost the same as the shape and size of the first casing 101, as viewed in the planar manner. In the second casing 102, the display 103 occupies a large part of a front surface 102a. A touch panel is disposed on the display 103 so as to overlap each other. Further, in the second casing 102, the back surface opposite to the display 103 is a shield surface for protecting the electronic device 100. An operation section that receives an operation performed on the electronic device 100 by a user, is implemented by the keyboard, the touch pad, and the touch panel.

As shown in FIGS. 1, 2, and 3, the hinge mechanism 120 includes a first rotation mechanism 120a and a second rotation mechanism 120b. The rotation mechanisms 120a and 120b are connected to the first casing 101 so as to be rotatable, in recesses on the far side of the first casing 101, and are connected to the second casing 102 so as to be rotatable, in recesses on the lower side of the second casing 102.

The hinge mechanism 120 is structured so as to allow the electronic device 100 to switch from a closed position through an opened position to an inverted position by the second casing 102 pivoting on a portion at which the first casing 101 and the second casing 102 are connected to each other. The second casing 102 can pivot on the portion at which the first casing 101 and the second casing 102 are connected to each other, to rotate about 360 degrees by means of the hinge mechanism 120. In the closed position, the front surface 102a of the second casing 102 overlaps the top surface 101a of the first casing 101. In the opened position, the second casing 102 is apart from the near side of the first casing 101. In the inverted position, the back surface of the second casing 102 overlaps the back surface 101b of the first casing 101. In the inverted position, a user is allowed to use the electronic device 100 like a tablet. When the second casing 102 is rotated in the direction opposite to the direction in which the closed position is switched to the inverted position, the electronic device 100 is returned from the inverted position through the opened position to the closed position. The application of the present disclosure is not limited to a notebook computer having a hinge mechanism that allows the second casing 102 to rotate relative to the first casing 101 about 360 degrees. The present disclosure is also applicable to notebook computers having standard opening and closing mechanisms.

[2. Structure of First Casing]

Figure 4:
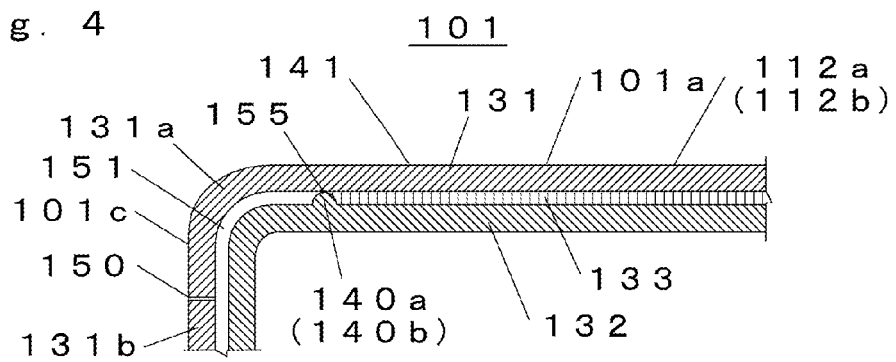
FIG. 4 is a cross-sectional view of a main portion of the first casing according to the embodiment.
Figure 5:
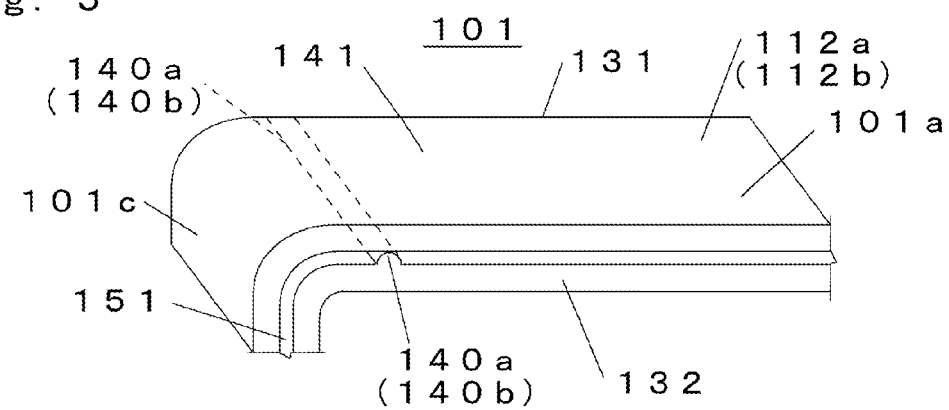
FIG. 5 is a perspective view of a cut portion of the first casing according to the embodiment.

FIG. 4 is a cross-sectional view of a main portion of the first casing 101 according to the present embodiment. FIG. 5 is a perspective view of a cut portion of the first casing 101 according to the present embodiment. FIG. 4 and FIG. 5 illustrate the near side portion of the first casing 101. In FIG. 5, an adhesive layer 133 described below is not illustrated.

As shown in FIG. 4 and FIG. 5, the first casing 101 includes: an outer layer member 131 that is formed by a metal and is exposed to the outside; an inner layer member 132 that is formed by a metal and is spaced from an inner surface of the outer layer member 131; and the adhesive layer 133 formed between the outer layer member 131 and the inner layer member 132. In the first casing 101, the inner layer member 132 is fixed to the outer layer member 131 by means of the adhesive layer 133. In the first casing 101, the adhesive layer 133 is partially formed. The first casing 101 includes a two-layered portion formed by the outer layer member 131 and the inner layer member 132 so as to be hollow therebetween, and a three-layered portion formed by the outer layer member 131, the adhesive layer 133, and the inner layer member 132.

The outer layer member 131 is a box-shaped component formed by aluminium (for example, a box-shaped component formed by an aluminium alloy). An outer surface of the outer layer member 131 is an outer surface of the first casing 101. A surface of the outer layer member 131 is subjected to alumite treatment, to be covered with a non-conductive film (aluminium oxide film) except for a region 155 in which the conductive projections 140a and 140b described below contact with the outer layer member 131. As a method for forming the region 155 by removing the non-conductive film from the outer layer member 131, a method for oxidizing the entire surface of the outer layer member 131, and then applying laser light to a portion corresponding to the region 155, can be used.

Further, as shown in FIG. 4, a minute gap 150 is formed, in the outer layer member 131, between an end of a front side member 131a and an end of a back side member 131b. The gap 150 is formed in an outer circumferential surface (outer circumferential surface of the outer layer member 131) of the first casing 101, which includes the front side end face 101c of the first casing 101. The gap 150 allows a space 151 between the outer layer member 131 and the inner layer member 132 to communicate with an external space.

The inner layer member 132 is a box-shaped component formed by magnesium (for example, a box-shaped component formed by a magnesium alloy). An inner surface of the inner layer member 132 is an inner surface of the first casing 101. On an outer surface of the inner layer member 132, two conductive projections 140a and 140b are formed so as to linearly extend on the outer surface of the inner layer member 132, as shown in FIG. 4 and FIG. 5.

The conductive projections 140a and 140b are formed in the main plate-shaped portion 141 having the top surface 101a of the first casing 101. Specifically, the conductive projections 140a and 140b are formed in the palm rest portions 112a and 112b, respectively, in the main plate-shaped portion 141. The conductive projections 140a and 140b are formed on the near side, among the near side and the far side, in the palm rest portions 112a and 112b, respectively. As shown in FIG. 2, the conductive projections 140a and 140b extend almost parallel to the front side end face 101c of the first casing 101.

As shown in FIG. 4 and FIG. 5, the conductive projections 140a and 140b are each formed as an elongated projection (projection extending like a ridge) in which the outer circumferential shape of the cross section is roughly semicircular. Each of the conductive projections 140a and 140b has a uniform cross-sectional shape in the length direction. A height of each of the conductive projections 140a and 140b is, for example, about 0.1 mm.

Each of the conductive projections 140a and 140b is a portion of the inner layer member 132. The inner layer member 132 is formed by casting, and the conductive projections 140a and 140b are formed by the casting. Namely, a mold for forming the inner layer member 132 has recesses corresponding to the conductive projections 140a and 140b, respectively. The conductive projections 140a and 140b are formed by magnesium, similarly to the inner layer member 132. The conductive projections 140a and 140b each have an electrical conductivity. The top end of each of the conductive projections 140a and 140b contacts with the region 155, in the inner surface of the outer layer member 131, which is not covered by a non-conductive film. The conductive projection 140 electrically connects, to the outer layer member 131, the inner layer member 132 inside which electronic components are provided.

The adhesive layer 133 is formed by an adhesive applied in a preparation step described below becoming set. The adhesive layer 133 is formed in the main plate-shaped portion 141. Specifically, the adhesive layer 133 is formed, in each of the palm rest portions 112a and 112b, between the outer layer member 131 and the inner layer member 132, in the main plate-shaped portion 141. In the palm rest portions 112a and 112*b*, the adhesive layer 133 is formed rearward of the conductive projections 140*a* and 140*b*. In the palm rest portion 112*a*, the adhesive layer 133 is formed, with respect to the conductive projection 140*a*, on a side opposite to a side on which the gap 150 closest to the conductive projection 140*a* is formed. In the palm rest portion 112*b*, the adhesive layer 133 is formed, with respect to the conductive projection 140*b*, on a side opposite to a side on which the gap 150 closest to the conductive projection 140*b* is formed.

[3. Method for Manufacturing First Casing]

Figure 6:
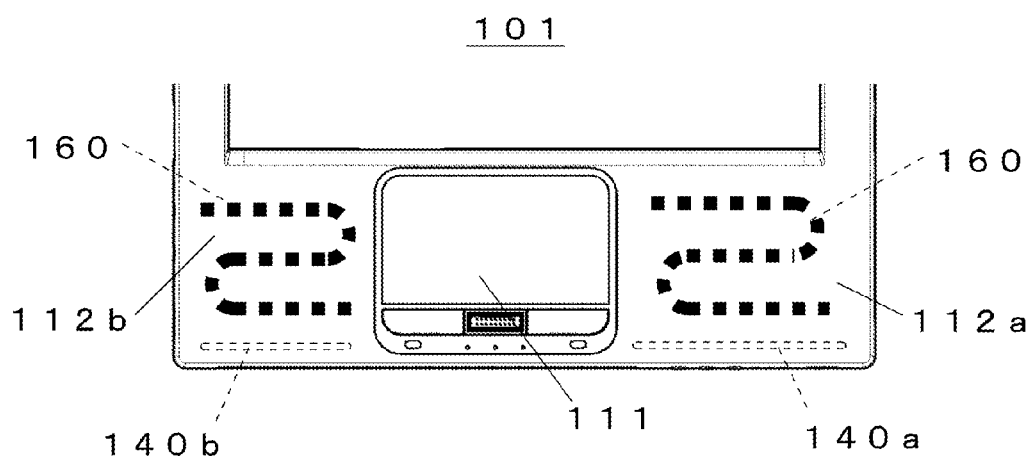
FIG. 6 is a top view illustrating a trace of an adhesive applied in a preparation step in the case of the first casing of the embodiment being manufactured.

FIG. 6 is a top view illustrating a trace 160 of an adhesive applied in a preparation step in the case of the first casing 101 of the present embodiment being manufactured. The method for manufacturing the first casing 101 includes a preparation step of applying an adhesive to the inner layer member 132, and a fixing step of fixing the inner layer member 132 to the outer layer member 131 by the adhesive after the preparation step has been performed.

In the preparation step, an adhesive is applied to a predetermined opposing surface (a surface to be formed as an outer surface of the inner layer member 132), of the inner layer member 132, which is to oppose the outer layer member 131. On the predetermined opposing surface, the two conductive projections 140*a* and 140*b* are each formed so as to extend like a line on the predetermined opposing surface. As shown in FIG. 6, the adhesive is applied lateral to each of the conductive projections 140*a* and 140*b*. Specifically, the adhesive is applied to the inner layer member 132 on the predetermined opposing surface that is in a region to be formed as the palm rest portions 112*a* and 112*b* and is located rearward (an upper portion in FIG. 6) of the conductive projections 140*a* and 140*b*. As shown in FIG. 6, the adhesive is applied so as to form the trace 160 that is meandered.

In the fixing step, the outer layer member 131 is disposed so as to overlap the inner layer member 132 over the predetermined opposing surface of the inner layer member 132. The inner layer member 132 and the outer layer member 131 are disposed so as to overlap each other such that the top ends of the conductive projections 140*a* and 140*b* contact with one surface of the outer layer member 131. By the conductive projections 140*a* and 140*b*, a distance between the outer layer member 131 and the inner layer member 132 is maintained constant. The adhesive is sandwiched between the outer layer member 131 and the inner layer member 132, and is spread by means of the outer layer member 131 and the inner layer member 132. At this time, the adhesive is sealed by the conductive projections 140*a* and 140*b*. The conductive projections 140*a* and 140*b* prevent the adhesive from leaking toward the near side portion forward of the conductive projections 140*a* and 140*b*. The adhesive is set in a state where the adhesive adheres to the side surfaces of the conductive projections 140*a* and 140*b*. Thus, the adhesive layer 133 is formed to integrate the inner layer member 132 and the outer layer member 131 with each other. After the fixing step has been performed, a step of mounting other components, and the like are performed, to complete the first casing 101.

The adhesive may not reach the conductive projections 140*a* and 140*b* depending on an amount of the adhesive. In such a case, in the first casing 101 having been manufactured, the adhesive layer 133 is formed so as to be close to one of the side surfaces of each of the conductive projections 140*a* and 140*b*.

[4. Effects and the Like]

In the present embodiment, the conductive projections 140*a* and 140*b* that are elongated are formed on the outer surface of the inner layer member 132 so as to electrically connect the inner layer member 132 to the outer layer member 131. A contact area (ground-contact area) of the inner layer member 132 in which the inner layer member 132 contacts with the outer layer member 131 as a ground potential is relatively large. A potential of the inner layer member 132 that is subjected to electric waves from electronic components becomes stable. Therefore, unneeded radiation from the first casing 101 can be reduced. The electronic device 100 of the present embodiment is effective in reducing unneeded radiation.

Further, in the present embodiment, the adhesive layer 133 is adhered to one side surface (the side surface on the far side) of each of the conductive projections 140*a* and 140*b*. This results from the adhesive being sealed by the conductive projections 140*a* and 140*b*. The adhesive exerts a sealing function. Further, the gap 150 is formed in the front side end face 101*c* of the first casing 101 such that a space between the outer layer member 131 and the inner layer member 132 communicates with the outside. In the main plate-shaped portion 141 of the first casing 101, the conductive projections 140*a* and 140*b* extend along the front side end face 101*c* of the first casing 101 in a region forward of the adhesive layer 133. Therefore, the conductive projections 140*a* and 140*b* can prevent the adhesive from flowing over the conductive projections 140*a* and 140*b* and leaking through the gap 150.

Further, in the present embodiment, the outer layer member 131 is formed by aluminium, and the inner layer member 132 is formed by magnesium. The outer layer member 131 is light in weight and excellent in outer appearance. A strength and formability can be enhanced for the inner layer member 132. Therefore, a strength of the first casing 101 can be enhanced without deteriorating an outer appearance of the first casing 101 while increase in weight of the first casing 101 can be restrained. Therefore, reliability of the electronic device 100 can be enhanced.

Further, in the present embodiment, the surface of the outer layer member 131 other than areas that contact with the conductive projections 140*a* and 140*b* is covered with a non-conductive aluminium oxide film. Normally, if an outer layer is treated with an aluminium oxide film, grounding becomes difficult. In the present embodiment, the oxide film is partially removed, to realize grounding in the area in which the oxide film is removed. Therefore, unneeded radiation can be reduced without deteriorating an outer appearance of the first casing 101.

Further, in the present embodiment, the conductive projections 140*a* and 140*b* are formed in the main plate-shaped portion 141 of the first casing 101, which includes the top surface 101*a* of the first casing 101. Therefore, a distance between the inner layer member 132 and the outer layer member 131 can be more easily controlled when the first casing 101 is manufactured, as compared to a case where each of the conductive projections 140*a* and 140*b* is formed on a side surface of the first casing 101.

Further, in the present embodiment, the adhesive layer 133 and the conductive projections 140*a* and 140*b* are provided in the palm rest portions 112*a* and 112*b*. Therefore, in the first casing 101, a strength of each of the palm rest portions 112*a* and 112*b* to which a user's weight is likely to be applied, can be enhanced.

Other Embodiments

As described above, the exemplary embodiment has been descried above as examples of the technology disclosed in the present application. However, the technology according to the present disclosure is not limited to the exemplary embodiment, and is also applicable to other embodiments realized by modifications, replacements, additions, omissions, or the like as appropriate. Furthermore, another exemplary embodiment can be implemented by combining the components described above for the exemplary embodiment.

Hereinafter, other exemplary embodiments will be described.

In the present embodiment, a notebook computer is described as an example of the electronic device 100. However, the electronic device 100 may be, for example, hand-held electronic game machines, and hand-held DVD players.

Further, in the present embodiment, an information processing apparatus having two casings 101 and 102 is described as an example of the electronic device 100. However, the electronic device 100 may be a tablet-type information processing apparatus having a single casing. The conductive projection is, for example, formed in the casing in the outer circumferential portion (bezel) outward of the display.

Further, in the present embodiment, the conductive projections 140a and 140b are formed as a portion of the inner layer member 132. However, the conductive projections 140a and 140b may be formed in the outer layer member 131. Namely, a projection for electrical connection may be formed from the outer layer member 131 side toward the inner layer member 132 side. In this case, in the fixing step, a conductive projection is formed in the outer layer member 131, on a predetermined opposing surface which is to oppose the inner layer member 132, so as to extend like a line on the predetermined opposing surface, and the outer layer member 131 having the conductive projection formed thereon is fixed to the inner layer member 132 so as to overlap the inner layer member 132 such that the conductive projection contacts with one surface of the inner layer member 132. However, as described above for the embodiment, the conductive projections 140a and 140b are preferably formed by casting from the viewpoint of a strength of the casing. Therefore, as described above for the embodiment, when the outer layer member 131 is formed by aluminium, and the inner layer member 132 is formed by magnesium, the conductive projections 140a and 140b are preferably formed on the inner layer member 132 since magnesium by which the inner layer member 132 is formed can be easily cast.

Further, in the present embodiment, the adhesive layer 133 is formed between the inner layer member 132 and the outer layer member 131. However, the adhesive layer 133 may not be formed. The inner layer member 132 and the outer layer member 131 may be integrated with each other by means of another fixing means such as a bolt.

Further, in the present embodiment, each of the conductive projections 140a and 140b is linearly formed. However, each of the conductive projections 140a and 140b may be curved, or bent so as to be L-shaped.

Further, in the present embodiment, in each of the conductive projections 140a and 140b, the outer circumferential shape of the cross-section is roughly semicircular. However, the cross-sectional shape of each of the conductive projections 140a and 140b is not limited thereto. The cross-section of each of the conductive projections 140a and 140b may have another shape such as a trapezoidal shape or a mountain-like shape.

Further, in the present embodiment, when the inner layer member 132 is formed by casting, the conductive projections 140a and 140b are formed. However, after the inner layer member 132 is formed by casing, the inner layer member 132 may be pressed to form the conductive projections 140a and 140b. Furthermore, after the inner layer member 132 is formed, an elongated metal may be integrated with the inner layer member 132 by welding, to from the conductive projections 140a and 140b.

Further, in the present embodiment, the number of each of the conductive projections 140a and 140b provided in the palm rest portions 112a and 112b, respectively, is one. The number of each of the conductive projections 140a and 140b provided in the palm rest portions 112a and 112b, respectively, may be greater than or equal to two. In this case, the conductive projections 140a may be formed on the near side and the far side in the palm rest portion 112a, and the conductive projections 140b may be formed on the near side and the far side in the palm rest portion 112b.

Further, in the present embodiment, the conductive projections 140a and 140b are provided in the palm rest portions 112a and 112b, respectively. However, each of the conductive projections 140a and 140b may be formed in another portion of the first casing 101. Each of the conductive projections 140a and 140b may be formed in, for example, a region which is implemented as the front side end face 101c of the first casing 101.

Further, in the present embodiment, the conductive projections 140a and 140b extend parallel to the front side end face 101c of the first casing 101. However, the conductive projections 140a and 140b may extend diagonally to the front side end face 101c of the first casing 101, or may extend perpendicular to the front side end face 101c.

As presented above, one embodiment has been described as an example of the technology according to the present disclosure. For this purpose, the accompanying drawings and the detailed description are provided.

Therefore, components in the accompanying drawings and the detail description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiment has been described to exemplify the technology according to the present disclosure, and therefore, various modifications, replacements, additions, and omissions may be made within the scope of the claims and the scope of the equivalents thereof.

What is claimed is:

1. An electronic device, comprising:
   a casing configured to accommodate electronic components, wherein
      the casing includes an outer layer member formed by a metal and exposed to an outside, and an inner layer member formed by a metal and spaced from an inner surface of the outer layer member,
      a conductive projection is formed between the inner layer member and the outer layer member, and is configured to extend in a line on a surface of one of the inner layer member and the outer layer member and have a top end that contacts with the other of the inner layer member and the outer layer member, to electrically connect between the inner layer member and the outer layer member,
      the casing further includes an adhesive layer formed between the outer layer member and the inner layer member that adheres the outer layer member and the inner layer member to each other, and the adhesive layer is adhered to one of side surfaces of the conductive projection or formed close to one of the side surfaces of the conductive projection.

2. The electronic device according to claim 1, wherein the conductive projection is formed on an outer surface of the inner layer member, so as to extend in a line on the outer surface, and the top end of the conductive projection contacts with the inner surface of the outer layer member to electrically connect between the inner layer member and the outer layer member.

3. The electronic device according to claim 1, wherein
the outer layer member is formed by aluminium, and
the inner layer member is formed by magnesium.

4. An electronic device, comprising:
a casing configured to accommodate electronic components, wherein
the casing includes an outer layer member formed by a metal and exposed to an outside, and an inner layer member formed by a metal and spaced from an inner surface of the outer layer member, and
a conductive projection is formed between the inner layer member and the outer layer member, and is configured to extend in a line on a surface of one of the inner layer member and the outer layer member and have a top end that contacts with the other of the inner layer member and the outer layer member, to electrically connect between the inner layer member and the outer layer member,
the conductive projection is formed on an outer surface of the inner layer member, so as to extend in a line on the outer surface, and the top end of the conductive projection contacts with the inner surface of the outer layer member to electrically connect between the inner layer member and the outer layer member, and
a surface of the outer layer member other than an area that contacts with the conductive projection is covered with a non-conductive film.

5. The electronic device according to claim 1, wherein
the casing has a main surface, and an outer circumferential surface that extends from an outer circumference of the main surface in a thickness direction of the casing, and
the adhesive layer and the conductive projection are formed in a main plate-shaped portion of the casing, which includes the main surface.

6. The electronic device according to claim 5, wherein
a gap is formed in the outer circumferential surface of the casing such that a space between the outer layer member and the inner layer member communicates with an outside through the gap, and
the adhesive layer is formed, with respect to the conductive projection, on a side opposite to a side on which the gap closest to the conductive projection is formed.

7. An electronic device, comprising:
a casing configured to accommodate electronic components, wherein
the casing includes an outer layer member formed by a metal and exposed to an outside, and an inner layer member formed by a metal and spaced from an inner surface of the outer layer member,
a conductive projection is formed between the inner layer member and the outer layer member, and is configured to extend in a line on a surface of one of the inner layer member and the outer layer member and have a top end that contacts with the other of the inner layer member and the outer layer member, to electrically connect between the inner layer member and the outer layer member, and
the casing comprises a first casing member having the outer layer member and the inner layer member, and having the conductive projection formed between the inner layer member and the outer layer member, and
a second casing member connected to a far side portion of the first casing such that the electronic device is openable and closable.

8. The electronic device according to claim 7, wherein
the first casing member further includes an adhesive layer that is formed between the outer layer member and the inner layer member and adheres the outer layer member and the inner layer member to each other, and
the adhesive layer is adhered to one of side surfaces of the conductive projection or formed close to one of the side surfaces of the conductive projection.

9. The electronic device according to claim 8, wherein the adhesive layer and the conductive projection are formed in a plate-shaped portion of the first casing member, which includes a top side surface of the first casing member.

10. The electronic device according to claim 9, wherein
a gap is formed in an outer circumferential surface on a near side of the first casing member such that a space between the outer layer member and the inner layer member communicates with an outside through the gap, and
the conductive projection extends along the outer circumferential surface on the near side of the first casing member in a region forward of the adhesive layer, in the plate-shaped portion of the first casing member.

11. The electronic device according to claim 10, wherein
the plate-shaped portion of the first casing member has a palm rest portion located forward of a keyboard,
the adhesive layer is formed in the palm rest portion, and
the conductive projection is formed, forward of the adhesive layer, in the palm rest portion.

12. The electronic device according to claim 11, wherein the conductive projection is formed in a region on a near side in the palm rest portion among the region on the near side in the palm rest portion and in a region on a far side in the palm rest portion.

* * * * *